US008565609B2

(12) United States Patent
Wilkinson et al.

(10) Patent No.: US 8,565,609 B2
(45) Date of Patent: Oct. 22, 2013

(54) DISTRIBUTION SYSTEM FOR OPTICAL REFERENCE

(75) Inventors: Steven R. Wilkinson, Stevenson Ranch, CA (US); Matthew T. Cashen, Beverly Hills, CA (US); Todd O. Clatterbuck, Playa Vista, CA (US)

(73) Assignee: Raytheon Company, Waltham, MA (US)

( * ) Notice: Subject to any disclaimer, the term of this patent is extended or adjusted under 35 U.S.C. 154(b) by 379 days.

(21) Appl. No.: 12/969,324

(22) Filed: Dec. 15, 2010

(65) Prior Publication Data
US 2012/0154062 A1 Jun. 21, 2012

(51) Int. Cl.
H04B 10/00 (2013.01)
(52) U.S. Cl.
USPC .......................... 398/154; 398/155; 398/163
(58) Field of Classification Search
USPC ........ 398/154, 155, 163, 66, 182; 331/66, 74, 331/94.1, 175, 182; 375/354
See application file for complete search history.

(56) References Cited

U.S. PATENT DOCUMENTS 3,751,900 A 8/1973 Phillips et al.
3,862,365 A 1/1975 Kobayashi et al.
7,024,121 B2* 4/2006 Rikitake et al. ............. 398/154
7,593,643 B2* 9/2009 Diels ............................. 398/146
7,593,644 B2* 9/2009 Kaertner et al. ............. 398/154
8,068,743 B2* 11/2011 Siepmann .................... 398/154
8,078,060 B2* 12/2011 Wilcox et al. ............... 398/154
2010/0278541 A1* 11/2010 Vidmar et al. .............. 398/154

OTHER PUBLICATIONS

Seth M. Foreman et al. ("Remote transfer of ultrastable frequency references via fiber networks", Review of Scientific Instruments 78. 021101 (2007)).*
"International Application Serial No. PCT/US2011/063882, Search Report mailed Mar. 26, 2012", 4 pgs.
"International application Serial No. PCT/US2011/063882, Written Opinion mailed Mar. 26, 2012", 4 pgs.
Alatawi, A, et al., "Radio-frequency clock delievery via free-space frequency comb transmission", vol. 34 No. 21, (Nov. 1, 2009), 3 pgs.
Foreman, Seth, et al., "Remote transfer of ultrastable frequency references via fiber networks", (Feb. 28, 2007), 25 pgs.
Holman, Kevin W, et al., "Optical phase coherent locking of a 1550-nm mode-locked source to an optical atomic clock's fs comb", 2 pgs.

* cited by examiner

Primary Examiner — M. R. Sedighian
(74) Attorney, Agent, or Firm — Schwegman Lundberg & Woessner, P.A.

(57) ABSTRACT

A system for distributing a reference oscillator signal includes a clock having a reference oscillator and a femtosecond laser stabilized by the reference oscillator. The system also includes at least one beamsplitter configured to split the femtosecond laser. The system further includes one or more remote nodes that are spaced from the clock. The remote nodes are configured to generate reference signals based on the split femtosecond laser.

22 Claims, 11 Drawing Sheets

| ELEMENT | IDENTIFIER IN FIG. 9 | BASE RADIUS (cm) | CONIC CONSTANT | HIGHER ORDER ASPHERIC TERMS | | | DECENTER | TILT | THICKNESS |
|---|---|---|---|---|---|---|---|---|---|
| | | | | A | B | C | | | |
| PINHOLE | 660 | INFINITY | | | | | 4.00 x | | -13.972464 |
| ENT. PUPIL | 620 | INFINITY | | | | | | | 13.972464 |
| PINHOLE | 660 | INFINITY | | | | | | | 46.022582 |
| PRIMARY | 680 | -57.92865 | 0.197407 | -.317662E-08 | -.621916E-11 | -.448629E-14 | 3.52905 y | 0.146423 α | -40.603305 |
| SECONDARY | 690 | -42.41150 | -1.357958 | -.415982E-05 | -.343696E-08 | -.527686E-11 | -27.24304 y | 11.527314 α | 39.583214 |
| TERTIARY | 700 | -150.47097 | 0 | 0.461963E-07 | 0.999511E-12 | -.128837E-14 | -19.41965 y | 11.004750 α | -41.334998 |
| GRATING | 710 | INFINITY | | | | | -43.26075 y | 15.699635 α  38.490592 β | 41.334998 |
| TERTIARY | 700 | -150.47097 | 0 | 0.461963E-07 | 0.999511E-12 | -.128837E-14 | -19.41965 y | 11.004750 α | -39.583214 |
| SECONDARY | 690 | -42.41150 | -1.357958 | -.415982E-05 | -.343696E-08 | -.527686E-11 | -27.24304 y | 11.527314 α | 40.603305 |
| PRIMARY | 680 | -57.92865 | 0.197407 | -.317662E-08 | -.621916E-11 | -.448629E-14 | 3.52905 y | 0.146423 α | -46.022582 |
| IMAGE | 720 | INFINITY | | | | | | | 0 |

NOTES:
THE DESIGNATORS x AND y INDICATE THE AXIAL DIRECTION OF THE DECENTER.
THE DESIGNATORS α AND β INDICATE TILT ROTATION ABOUT THE x AND y AXIS RESPECTIVELY.
ALTHOUGH FIGURE 9 DEPICTS A VERTICALLY DECENTERED PINHOLE FOR SIMPLICITY, THE PRESCRIPTION ABOVE YIELDS A HORIZONTALLY DECENTERED PINHOLE.

FIG. 10

DISTRIBUTION SYSTEM FOR OPTICAL REFERENCE

BACKGROUND

This disclosure relates generally to timing synchronization. More particularly, this disclosure may relate to systems and methods of synchronizing remote clocks with sub-picosecond precision, and distributing such precision across remote devices and systems.

Early clocks utilized the constant movement of an object to mark the passage of time. Such movement could include the motion of the sun across the sky (or shadows formed from the same), or the flow of water or sand at a relatively constant rate. Modern clocks, however, are the product of two components: an oscillator and a time interval counter. The oscillator precisely demarcates intervals of time, while the time interval counter advances the interval of time based on the completion of a determined number of oscillations. Although the vibration of quartz crystals utilized in modern clocks for everyday use permits accuracy to within a minute each year, there are situations where even greater accuracy becomes important.

Atomic clocks, which rely on oscillation between energy levels of atoms when probed by microwaves, have greatly advanced timekeeping in the past fifty years. For example, the standard definition of a second utilizes probing the oscillation of cesium-133 with microwaves at a frequency of approximately $9.192 \times 10^9$ Hz. While the first atomic clock, which utilized a beam of hot cesium atoms, was stable to about one part in $10^{10}$, further developments such as progressing to a fountain of cold cesium atoms has allowed an average stability of about one part in $10^{13}$. However, the greater stability provided by cooling the cesium atoms is limited by the potential for collisions between the atoms in the fountain, which may shift the frequency of the atomic transition. From fountain clocks, the state of the art has progressed even further. By utilizing light as opposed to microwaves, optical clocks allow a much greater frequency for measuring the atomic transitions. For example, instead of the $10^{10}$ Hz frequency of microwaves, light has a frequency of about $10^{15}$ Hz, allowing potentially greater clock stability.

The distribution and synchronization of the precise timing signals of advanced clocks, such as optical clocks, is increasingly important when dealing with communication and data transfer of remote elements. For example, satellite networks, electrical grids, differing subsystems of airplanes, and scientific laboratories across the globe, may desire highly synchronized master clocks, or the ability to receive precision timing from a master clock. As one non-limiting example, synchronized clocks are utilized when dealing with satellite communication, both in the context of satellite to satellite, as well as satellite to ground. The immense speed of orbiting bodies adds to the desirability of knowing exactly when particular actions should take place in a first system, so as to be harmonious with actions in a remote second system. In some contexts, precision timing may relate to knowing when a particular system, such as a satellite, is within communications range for a transmitter, while in other contexts, this may relate to delaying communications for synchronous data transfers, such as between satellites in a constellation or array, or between satellites and the ground. Effects of synchronization error include limiting the navigation accuracy of global positioning systems (GPS), and less precise data correlation between different sources, and instabilities in electrical grids.

What are needed are systems and methods that permit enhanced distribution of precise signals from clock systems, and enhanced synchronization between clock systems.

SUMMARY

According to an embodiment, a system for distributing a reference timing signal comprises a clock comprising a reference oscillator associated with the reference timing signal, and a femtosecond laser configured to produce a femtosecond laser pulse sequence stabilized by the reference oscillator. The system also includes at least one beamsplitter configured to split the femtosecond laser pulse sequence into one or more split laser pulse sequences. The system further includes one or more remote nodes that are spaced from the clock, and configured to generate distributed timing signals associated with the reference timing signal, based on associated ones of the one or more split laser pulse sequences.

According to another embodiment, a method for distributing a reference timing signal includes generating, at a reference oscillator, a reference oscillation associated with the reference timing signal. The method also includes producing, with a femtosecond laser, a femtosecond laser pulse sequence stabilized by the reference oscillation. The method additionally includes splitting the femtosecond laser pulse sequence into one or more split laser pulse sequences. The method further includes generating, at one or more remote nodes spaced from the clock and associated with the one or more split laser pulse sequences, distributed timing sequences associated with the reference timing signal, based on the femtosecond laser pulse sequence.

According to another embodiment, a clock comprises a reference oscillator and a femtosecond laser configured to produce a femtosecond laser pulse sequence stabilized by the reference oscillator. The clock further includes a beamsplitter in a path of the femtosecond laser pulse sequence, configured to redirect at least a portion of the femtosecond laser pulse sequence to a distribution system. The distribution system comprises a transfer laser configured to produce a frequency reference that is locked to the femtosecond laser pulse sequence, and one or more beamsplitters configured to distribute the frequency reference of the transfer laser to one or more remote nodes.

Other aspects and embodiments will become apparent from the following detailed description, the accompanying drawings, and the appended claims.

BRIEF DESCRIPTION OF THE DRAWINGS

Various features of embodiments of this disclosure are shown in the drawings, in which like reference numerals designate like elements.

FIG. 10 is a table depicting a prescription for a spectral interferometer configured to interfere the femtosecond laser pulses to ascertain the time delay;

DETAILED DESCRIPTION

Figure 1:
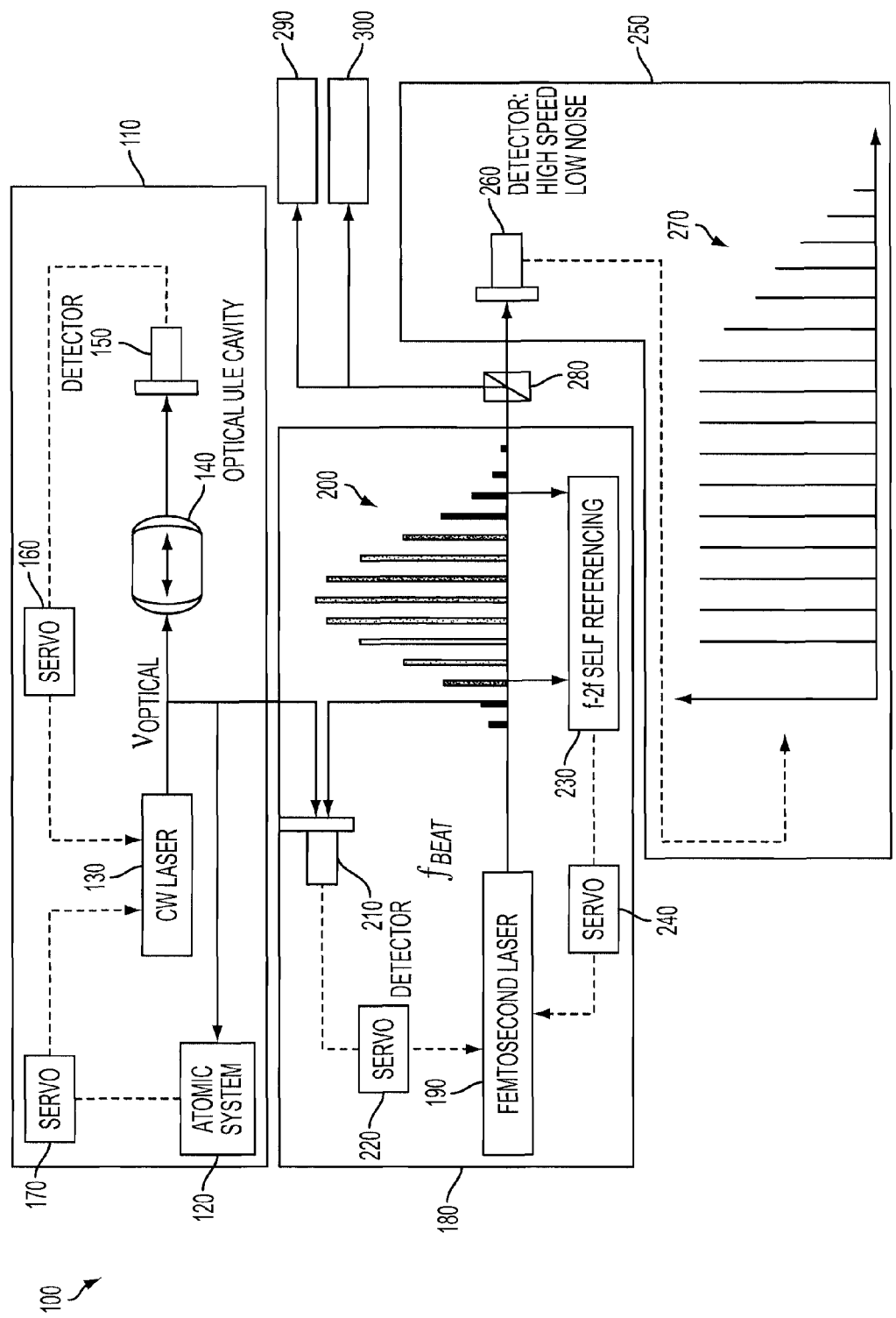
FIG. 1 schematically depicts an optical clock with a reference oscillator stabilizing a femtosecond laser.

FIG. 1 depicts a general system-level schematic for clock 100. As shown, clock 100 contains reference oscillator 110. In an embodiment, reference oscillator 110 may be an optical system of any suitable construction or configuration. In an embodiment, reference oscillator 110 may be characterized by the configuration of atomic system 120. Atomic system 120 may be of any configuration, including but not limited to being ion or lattice based. In an embodiment where atomic system 120 is ion-based, blue to ultraviolet (UV) lasers may interact with a single ion to provide and detect a standard reference oscillation. In other embodiments, such as that illustrated in FIG. 1, atomic system 120 is neutral atom based. In an embodiment in which atomic system 120 is neutral atom based, a neutral atom trap may utilize a visible and/or short wave infrared (SWIR) laser, which may be laser-cooled with a magneto-optical trap (MOT), to probe transitions in the atoms. In various embodiments, atomic system 120 may utilize any suitable atomic transition, including but not limited to those found in cesium, calcium, magnesium, mercury, rubidium, aluminum, strontium, ytterbium, or so on, depending on the configuration of clock 100.

As shown in the illustrated embodiment, reference oscillator 110 comprises continuous wave laser 130, which may be cavity stabilized by ultra-low expansion cavity 140. Continuous wave (CW) laser 130 may be of any suitable construction or configuration, including but not limited to fiber lasers, diode lasers, gas lasers, and solid state lasers. Likewise, optical ultra-low expansion (ULE) cavity 140 may be of any suitable construction or configuration, including, for example, comprising a block of ULE glass to frequency stabilize CW laser 130. CW laser 130 may be tuned by detecting the laser output by detector 150, and adjusting CW laser 130 feedback through servo 160. Also as shown, CW laser 130 is referenced to atomic system 120, and CW laser 130 may be further adjusted by atomic system 120 through servo 170.

The stability of CW laser 130 may then be transferred to optical divider 180, which may count the oscillations of reference oscillator 110 in intervals. As shown, femtosecond (fs) laser 190 is configured to generate femtosecond frequency comb 200, which is locked to reference oscillator 110 through common detector 210. Common detector 210 may adjust femtosecond laser 190 through servo 220. Additionally, as shown, femtosecond laser 190 may be further adjusted by applying f-2f self referencing scheme 230 to femtosecond frequency comb 200, where further adjustment may be provided by servo 240. In an embodiment, f-2f self referencing scheme 230 may comprise, for example, locking the beat note between the frequency doubled lower-frequency end of the comb spectrum with the higher-frequency end, to further stabilize femtosecond laser 190.

Locally at clock 100, femtosecond laser 190, as adjusted by optical divider 180, may be detected by microwave converter 250. Microwave converter 250 may then be used by a time interval counter to accurately mark the passage of time based on the reference oscillator 110. As shown, microwave converter 250 may include detector 260 that may mix a number of comb lines from femtosecond frequency comb 200 together to produce microwave frequency comb 270. Detector 260 may be of any suitable construction or configuration that is capable of detecting femtosecond frequency comb 200 as emitted by femtosecond laser 190. In an embodiment, the output of microwave frequency comb 270 may be an integer multiple of the fundamental repetition rate of femtosecond laser 190 generating the optical femtosecond frequency comb 200. As shown, in an embodiment detector 260 is a high speed low noise detector. In some embodiments, detector 260 may be of an Indium Gallium Arsenide (InGaAs) or Indium Antimonide (InSb) configuration.

Microwave converter 250 may include a time interval counter (not shown), which may count the oscillations passed through optical divider 180. Following the passage of a predetermined number of oscillations, the timer increments by one second. The number of oscillations will depend on the frequency of microwave frequency comb 270 as divided down from femtosecond frequency comb 200. In an embodiment, the time interval counter may utilize the zero crossing of one of the frequencies derived from the microwave comb as it moves from a negative voltage to a positive voltage. In an embodiment, the optical frequencies of the optical divider 180 may be divided to obtain the input frequency required by the time interval counter, which may eliminate any necessity for a high resolution time interval counter. The incrementing of time by the time interval counter may be displayed by any suitable mechanism or system. For example, the time may be displayed by an analog or digital clock output that shows current time, elapsed time from a reference time point, or so on. The display may utilize a computer readable medium, and in various embodiments may be distributed via radio waves, a computer network, or any other non-transitory storage mechanism. In some embodiments, the display may also output the frequency of the reference provided to the time interval counter.

As clock 100 further shows, beamsplitter 280 may be provided to redirect some of the femtosecond laser pulse from optical divider 180 out towards distribution system 290 and/or synchronization system 300, described in greater detail below.

Figure 2:
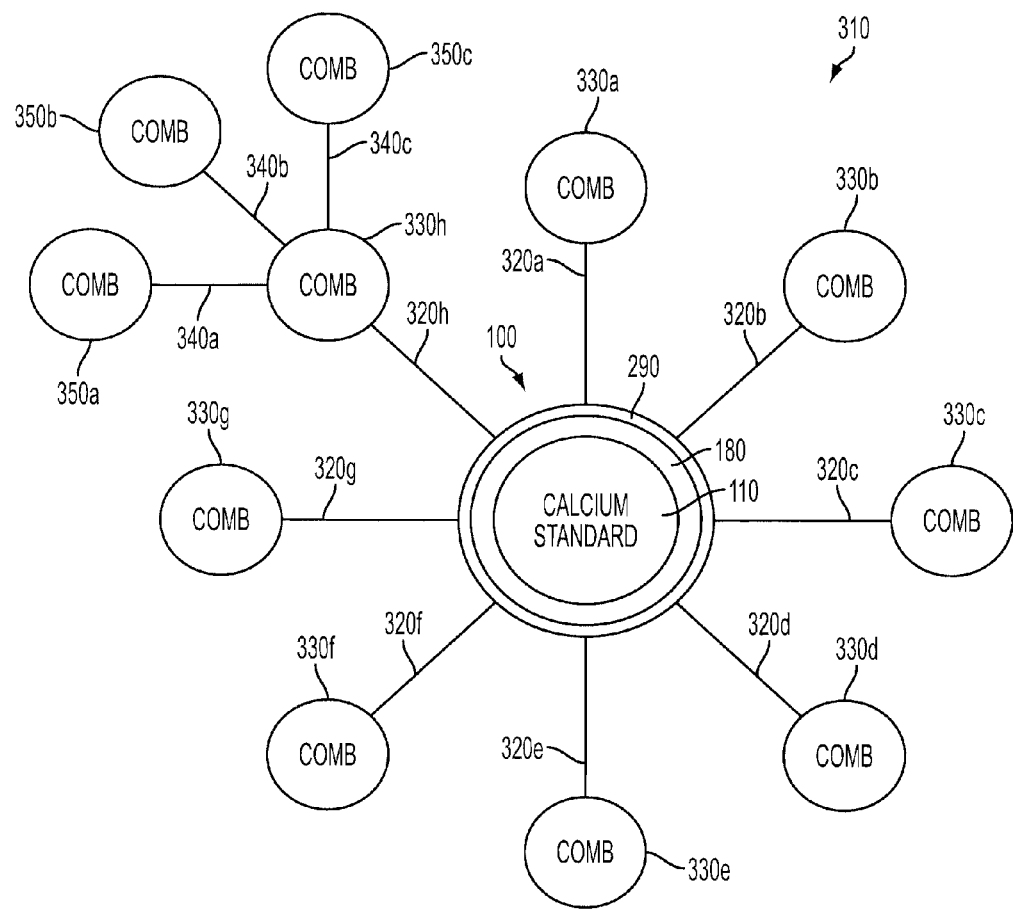
FIG. 2 schematically depicts a distribution network, where the optical clock of FIG. 1 standardizes the oscillations of remote frequency combs.

FIG. 2 depicts a system architecture for an embodiment of distribution network 310, which utilizes distribution system 290. In an embodiment, clock 100 (shown in the Figure to utilize a calcium standard for reference oscillator 110) may be provided as the central hub, wherein the precision of the laser pulse from optical divider 180 is distributed to many clocks simultaneously. In an embodiment, distribution system 290 may contain one or more beamsplitters or multiplexers configured to form various distribution beams 320 (individually distribution beams 320a-h) extending from clock 100 to a plurality of nodes 330 (individually associated nodes 330a-h). Distribution beams 320 may be propagated to nodes 330 by any suitable mechanism. For example, the beam transfer may occur in free space, or over fiber optic cables. In an embodiment, each of nodes 330 may comprise microwave converters 250, which may permit the stable femtosecond frequency comb 200 of the femtosecond laser pulse to be detected and divided down into microwave frequency combs 270. Each node 330 may additionally have their own time interval counter and time output (i.e. a display, an electronic timing signal, or so on), so that the precision from reference oscillator 110 is properly distributed throughout distribution network 310. In an embodiment, the precision frequency distributed to one or more of nodes 330 may be from microwave frequency comb 270, instead of from femtosecond frequency comb 200, where the microwave frequencies resulting from the converter 250 may be transferred over coaxial cable or free space. In an embodiment, distribution network 310 may be configured to account for delay offsets between reference oscillator 110 and nodes 330, such as those that may be present in distribution beams 320. In an embodiment, each node 330 may have approximately the same fractional frequency instabilities as clock 100. In an embodiment, each node 330 may divide down to microwave or radio frequency (RF) for the local timing sequences.

Some of nodes 330, such as node 330h in FIG. 2, may further contain beamsplitters or multiplexers to permit further subdivision and distribution of the femtosecond beam from additional distribution beams 340 to additional nodes 350. In the illustrated embodiment, additional distribution beams 340a-c extend from node 330h to distribute the precision of reference oscillator 110 to additional nodes 350a-c. In some embodiments, the additional distribution from one or more of nodes 330 to one or more of additional nodes 350 may be from an associated microwave converter 250 in nodes 330, such that the precision distributed over additional distribution beam 340 is from a microwave frequency comb 270 associated with one of nodes 330.

Figure 3:
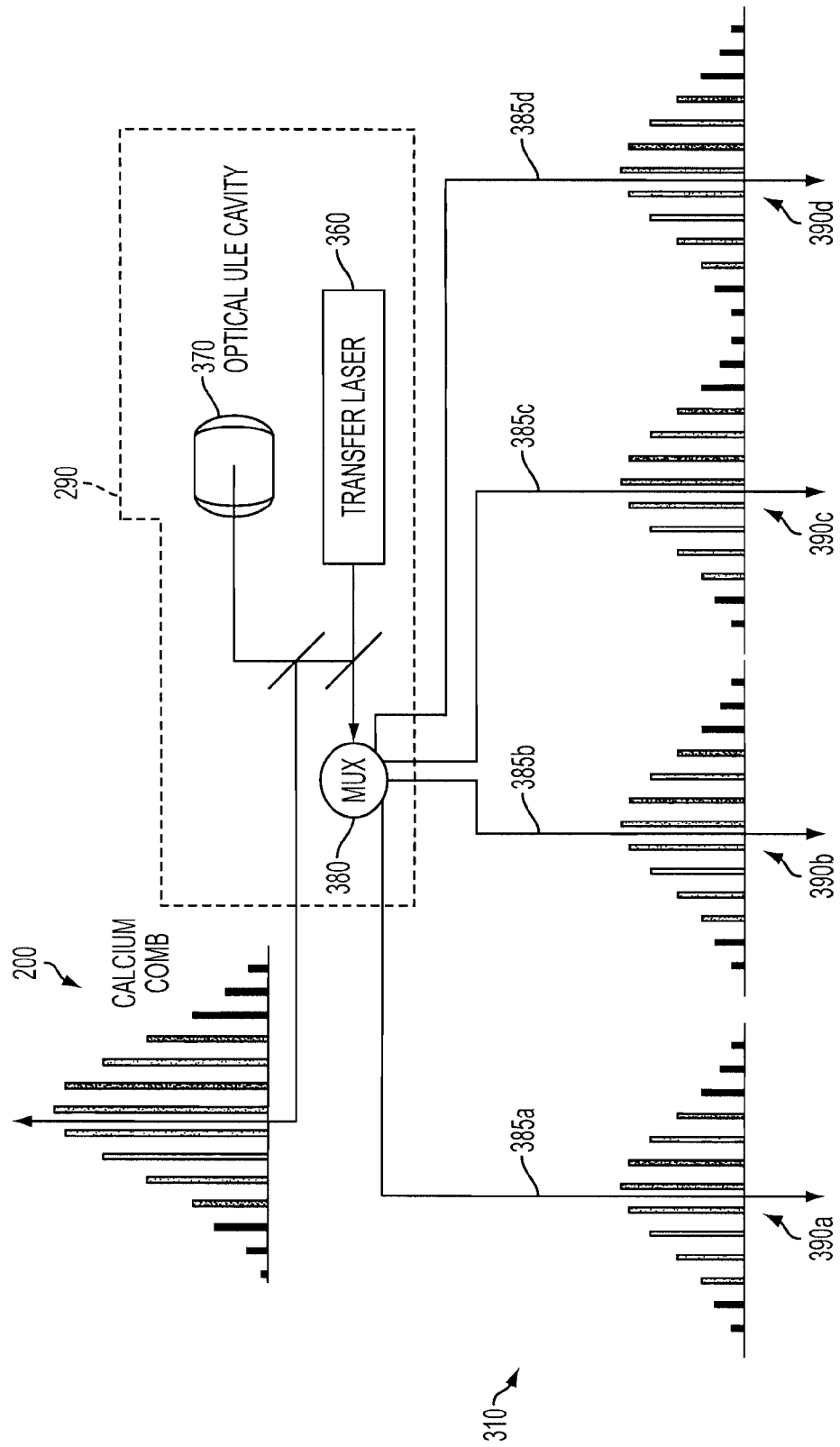
FIG. 3 schematically depicts an embodiment of a distribution system used to provide the stabilized oscillations of the reference oscillator to remote frequency combs in the distribution network of FIG. 2.

In some embodiments, the laser that is output from reference oscillator 110, stabilized by optical ULE cavity 140, may be transmitted throughout distribution network 310 such that one or more of nodes 330 and/or additional nodes 350 may have their own associated optical divider 180 with which to divide the stability of the reference oscillator 110 at the remote nodes 330 or additional nodes 350. One embodiment of distribution system 290 is shown in FIG. 3, where distribution system 290 is configured to utilize transfer laser 360, which in an embodiment may be a continuous wave laser similar to CW laser 130, and may be cavity stabilized similar to that of reference oscillator 110. In an embodiment, transfer laser 360, stabilized by optical ULE cavity 370, may be configured to generate a frequency reference beam that is locked onto one of the optical lines of femtosecond frequency comb 200 associated with reference oscillator 110. As shown, multiplexer 380 splits the laser beam for transfer across distribution beams 385 (i.e. distribution beams 385a-d in the illustrated embodiment) to a plurality of associated remote femtosecond frequency combs 390a-d, where each remote femtosecond frequency comb 390 is associated with a separate remote node. Although four remote femtosecond frequency combs 390a-d are shown, multiplexer 380 may distribute beams to N nodes, each with their own remote femtosecond frequency comb 390. In various embodiments, distribution beams 385 may transmit the beams through the air, by fiber-optic cables, or by any other transmission mechanism. In an embodiment, distribution beams 385, emitted by transfer laser 360, may act as the beam from reference oscillator 110 in FIG. 1. For example, in an embodiment, each remote node 330 or additional node 350 may contain a remote optical divider and/or a remote microwave converter, which in some embodiments may be similar to optical divider 180 and microwave converter 250 of clock 100. In such an embodiment, each remote femtosecond frequency comb 390 may be similar to femtosecond frequency comb 200 of optical divider 180, only would be stabilized by the beam from transfer laser 360, instead of the beam from reference oscillator 110.

In an embodiment, the laser beams distributed by multiplexer 380 are used to lock each remote femtosecond frequency comb 390 such that the comb spacing has the same spacing as the primary reference (i.e. femtosecond frequency comb 200). In an embodiment, a microwave signal is generated in a beat note between the comb lines of the remote femtosecond frequency combs 390 and the femtosecond frequency comb 200 transmitted via transfer laser 360. Once each remote femtosecond frequency comb 390 has the same spacing as the femtosecond frequency comb 200, all clocks in the distribution network 310 would share the same frequency, and associated time interval counters may count the oscillations found in the frequency accordingly, without requiring separate reference oscillators 110, such as the calcium magneto-optical trap (MOT) that establishes the frequency for femtosecond frequency comb 200, at each remote site across the links of distribution network 310. In an embodiment, adding another transfer laser 360 at a different frequency, locked to a different comb line contained in 200, may supply additional beams 385.

Figure 4:
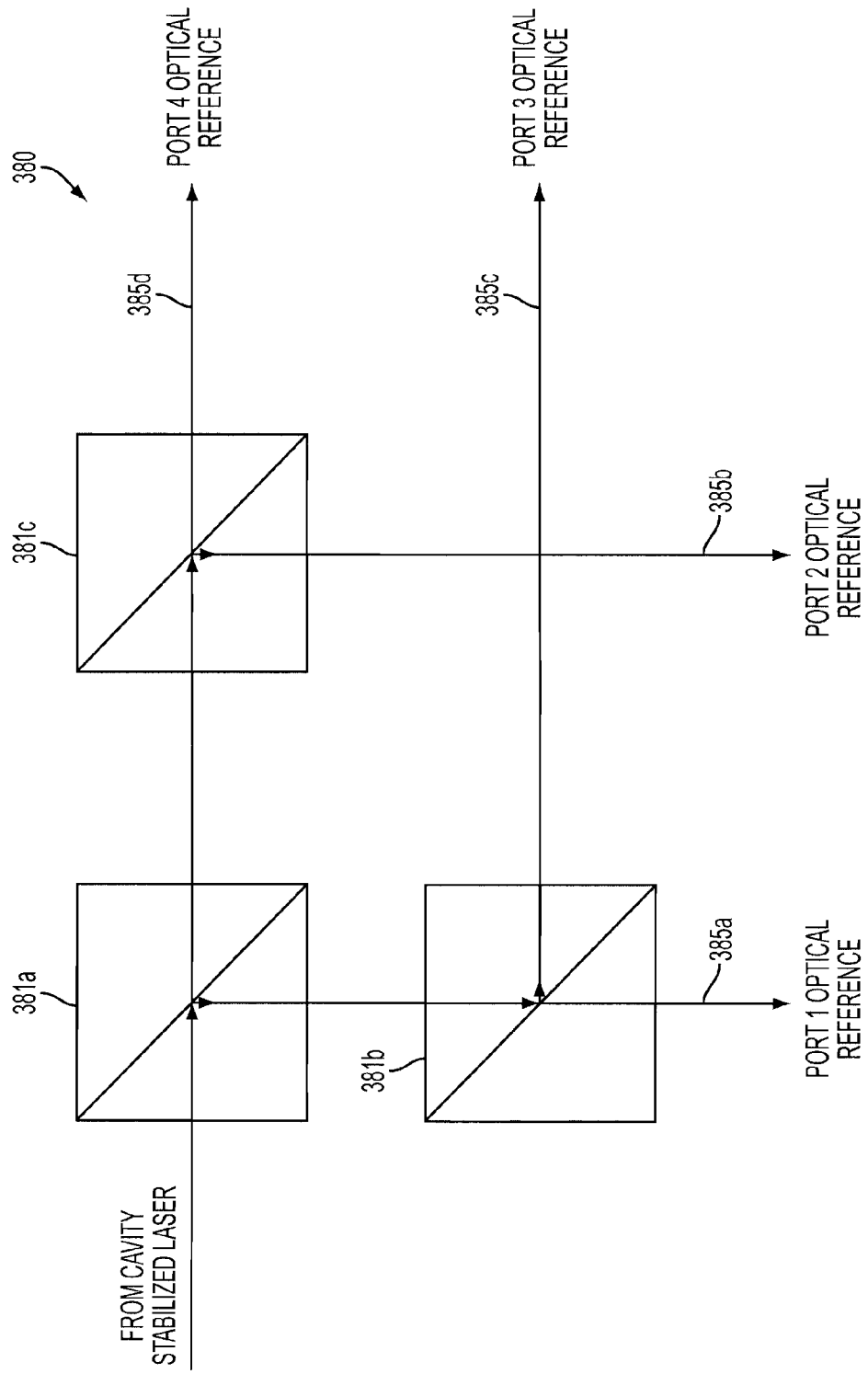
FIG. 4 shows an embodiment of a multiplexer of the distribution system of FIG. 3.

An example of an embodiment of multiplexer 380 is shown in FIG. 4. As shown, the beam from the cavity stabilized laser (such as transfer laser 360) is directed towards an array of beamsplitters 381. The beam may first impact beamsplitter 381a, wherein it is redirected towards beamsplitters 381b and 381c. Each of those two beamsplitters further split the beams, as shown, towards optical reference ports as distribution beams 385 (specifically distribution beams 385a-d in the illustrated embodiment). If additional remote femtosecond frequency combs 390 are to be utilized, additional beamsplitters 381 may be in multiplexer 380. Alternatively, one or more additional multiplexers 380 may be positioned and associated with one or more of distribution beams 385. In an embodiment, another transfer laser 360 may be provided, again locked to a different comb line.

Figure 5:
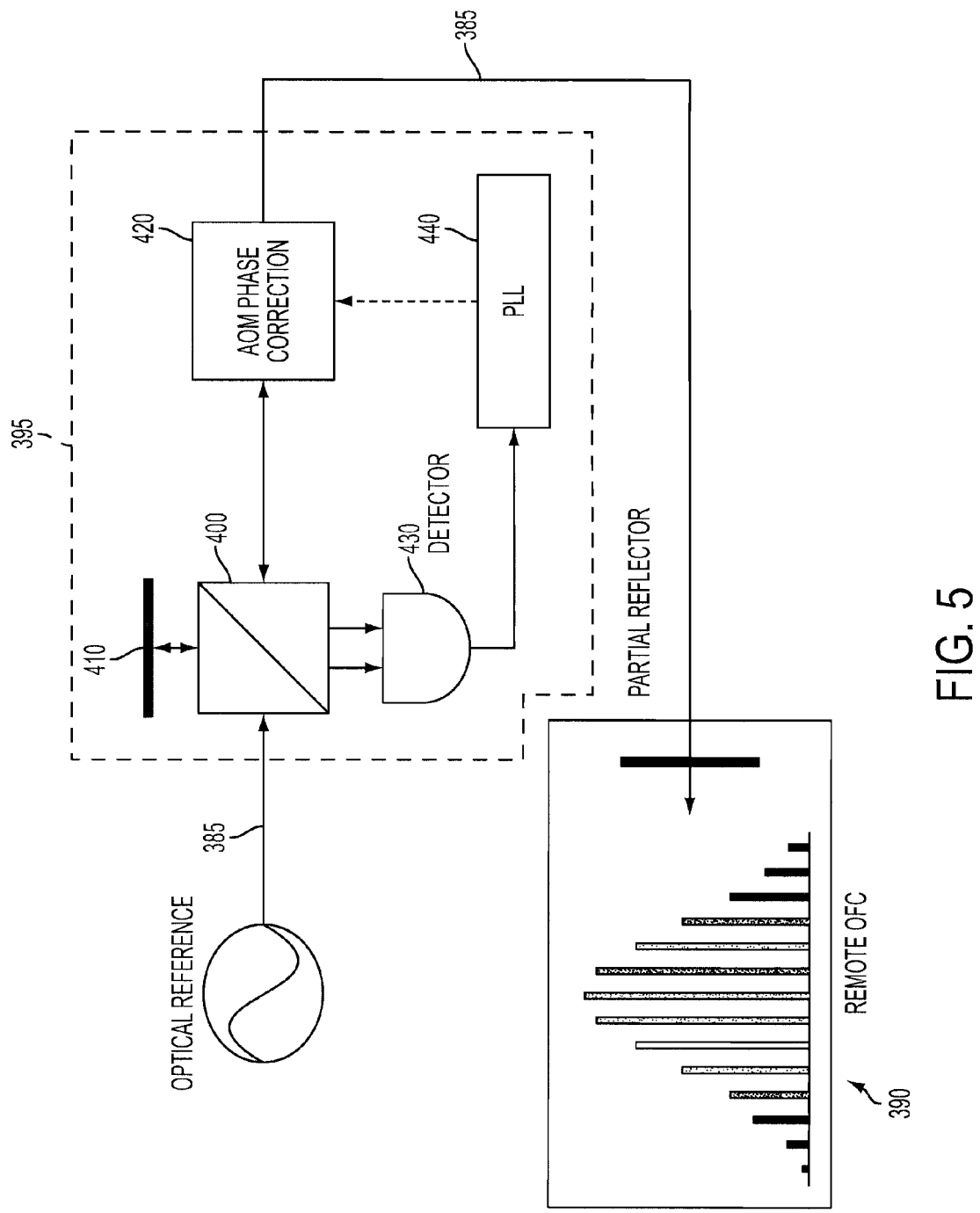
FIG. 5 shows an embodiment of a noise cancellation system that may be utilized in embodiments of the distribution system of FIG. 3, for example.

FIG. 5 depicts how, in an embodiment, each distributed beam stemming from multiplexer 380 may undergo noise reduction or cancellation via noise reduction system 395. Noise reduction via noise reduction system 395 may be applied to each beam path, such as distribution beams 385 distributed from multiplexer 380. In the illustrated embodiment, the noise cancellation may be applied within multiplexer 380 for each path of distribution beams 385, following distribution of the beam from the optical reference (not shown). Once the beam from transfer laser 360, that is locked to femtosecond frequency comb 200 (i.e. the optical reference), passes through the multiplexer 380, it may encounter beamsplitter 400 that further splits the beam between mirror 410, acousto-optical modulator 420, and detector 430. As the beam is analyzed by detector 430, phase locked loop 440 adjusts the phase shift in acousto-optical modulator 420 to further stabilize the beam as it traverses a distribution medium containing beam 385 directed towards remote femtosecond frequency comb 390.

Since distribution network 310 obtains stability from reference oscillator 110, distribution beams 385 become the reference for remote femtosecond frequency combs 390. Further microwave converters 250 may be associated with remote femtosecond frequency combs 390 to generate remote microwave signals. The stability of such optically generated microwave signals may have the same stability as the optical reference (i.e. from reference oscillator 110), which may be significantly better than the stability of current cesium standards.

In some embodiments, the architecture of the distribution network may be sufficient to allow transmission of the timing signal from reference oscillator 110 to remote nodes up to approximately several hundred kilometers away. In some such embodiments, the separation between reference oscillator 110 and the remote nodes/combs (i.e. 330, 350, 390) may be limited by the ability of the noise reduction technique depicted in FIG. 5 to keep phase distortions in the beams stationary over the round trip time from the remote comb 390 to the noise reduction system 395, regardless of the propagation medium (i.e. fiber or free space).

Figure 6:
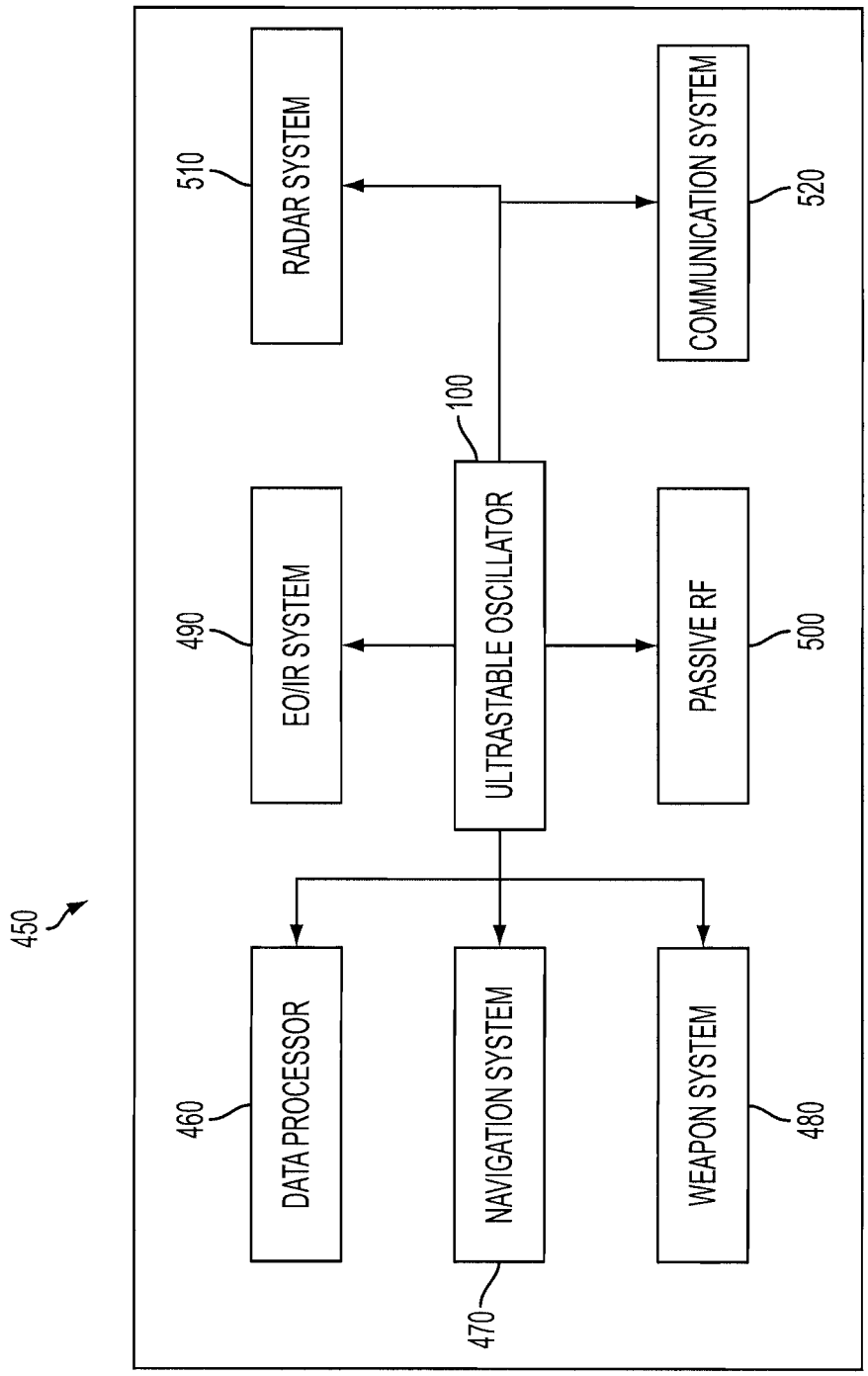
FIG. 6 shows an example of an embodiment of a distribution network.

Although, as noted above, in some embodiments the separation of distribution network 310 may be hundreds of kilometers apart, in other embodiments the distribution may generally operate on a local scale. For example, as is shown in FIG. 6 clock 100 is part of local system 450 that contains numerous local subsystems. In the figure, clock 100 contains at least reference oscillator 110 and femtosecond laser 190, and is configured to distribute the clock stability and accuracy through local system 450. Local system 450 may be of any construction or configuration, including but not limited to a land, sea, air, or space based military platform or other commercial network or telecommunication system. In some embodiments, local system 450 may be a single vehicle, while in other embodiments local system 450 may comprise a plurality of vehicles or systems that are synchronous and phase coherent and can be optically linked for intermittent or continuous updating of the phase and frequency alignment of separated local subsystems. In the illustrated embodiment, local system 450 contains data processor 460, navigation system 470, and weapon system 480. Also depicted are electro-optical/infrared (EO/IR) system 490, passive RF system 500, radar system 510, and communications system 520. Such remote elements may make use of the ultrastable signal from reference oscillator 110 for any number of purposes. As one example, navigation system 470 may utilize the clock oscillations in harmony with a global positioning system to accurately determine the position of local system 450, or elements of local system 450, for course-plotting purposes.

In some embodiments, clock 100 may convert from optical to microwave through microwave converter 250, and distribute the microwave signal to each subsystem in local system 450. In other embodiments, clock 100 may distribute femtosecond frequency combs optically, and convert to microwave at each subsystem, with each subsystem having a local microwave converter 250. In some embodiments, a mix of distributions may be performed, whereby some subsystems (i.e. radar system 510) may receive a microwave signal, while other subsystems (i.e. EO/IR system 490) may utilize an optical link to an EO system laser. Each of the subsystems tied to clock 100 in local system 450 may utilize separate remote combs that are receptive to signals that are optical (i.e. remote femtosecond frequency comb 390) or microwave based. In some embodiments, each subsystem of local system 450 may contain their own noise reduction system 395, as described above.

Figure 7:
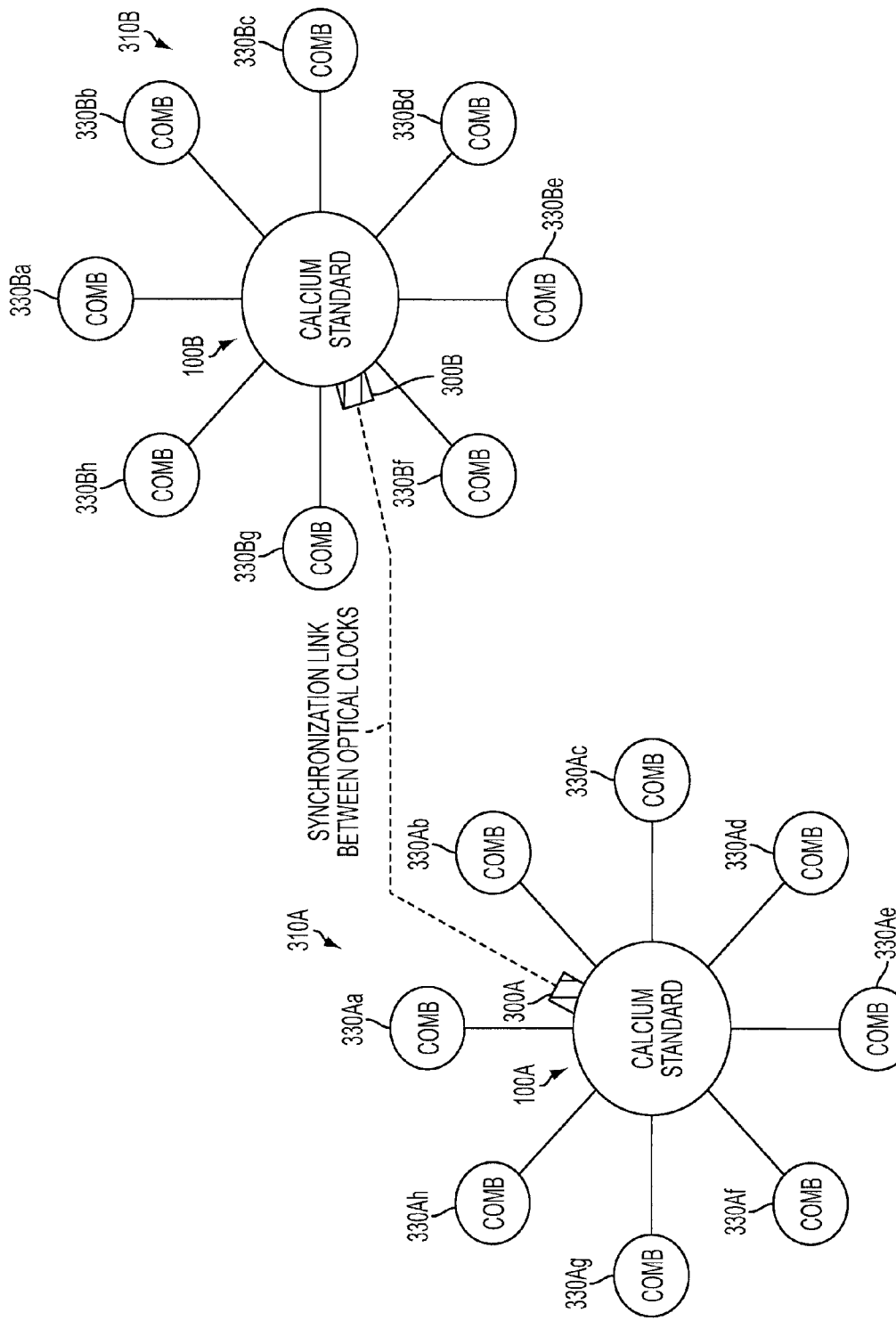
FIG. 7 schematically shows an embodiment of a pair of distribution networks, each comprising a respective clock, wherein the clocks are synchronized by a synchronization system.

In some embodiments, such as when remote nodes are of a sufficient distance that linking through distribution system 290 is unfeasible, separate remote nodes, each having their own clock 100 (with reference oscillator 110) may be utilized, forming separate distribution networks 310. Shown in FIG. 7 are distribution network 310A and distribution network 310B, each having their own clock 100 (i.e. master clock 100A and slave clock 100B, the master/slave configuration being described in greater detail below). The precise oscillation of clocks 100 are distributed from their associated reference oscillators 110 to a plurality of remote nodes 330. In the illustrated embodiment, the remote nodes for distribution network 310A are labeled as remote nodes 330Aa-330Ah, while the remote nodes for distribution network 310B are labeled as remote nodes 330Ba-330Bh. To ensure consistent time between the nodes of distribution network 310A and distribution network 310B, it may be desirable to synchronize master clock 100A and slave clock 100B. As shown in FIG. 7, clocks 100 may be linked between associated synchronization systems 300. Synchronization system 300A associated with master clock 100A, and synchronization system 300B associated with slave clock 100B, may be spaced by any appropriate distance, as described in greater detail below.

Figure 8:
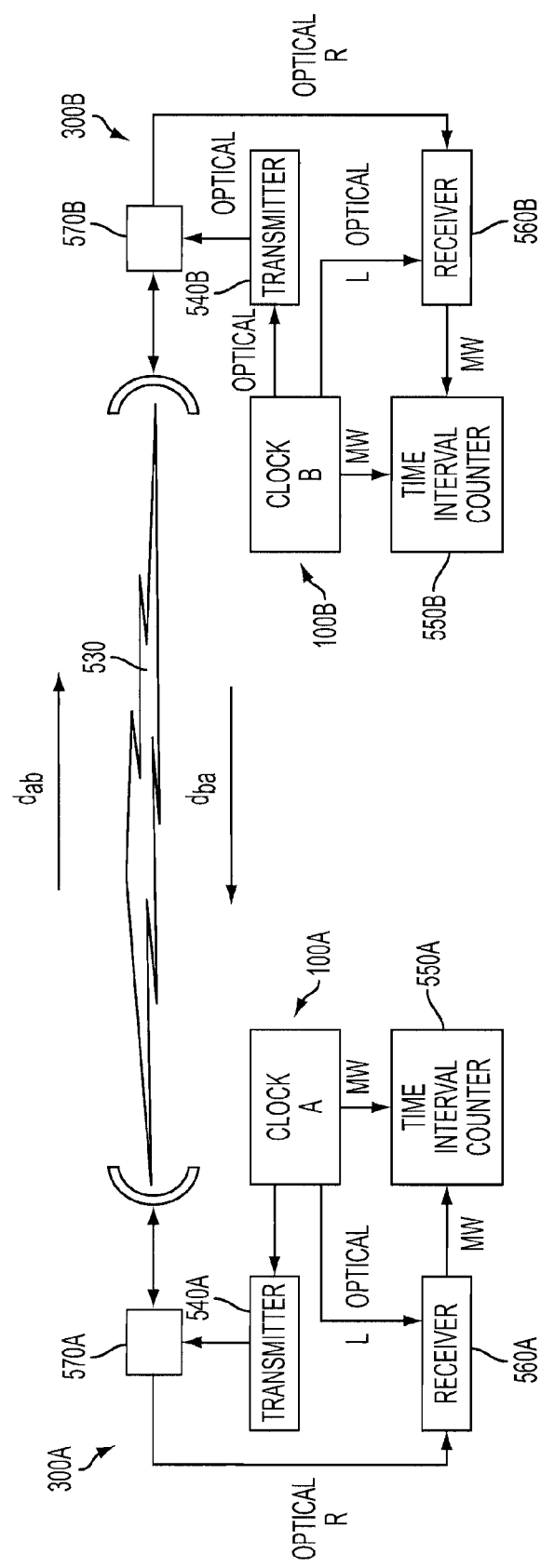
FIG. 8 shows another embodiment of the clocks linked by the synchronization system.

FIG. 8 shows a schematic view of the linking of synchronization system 300A and synchronization system 300B, across propagation medium 530. As is broadly depicted, each clock 100 is connected to transmitter 540 and time interval counter 550. Time interval counters 550 are also connected to receivers 560, and in an embodiment receive microwave signals from receivers 560 and clocks 100 to count time increments. Both transmitters 540A/B and receivers 560A/B may be coupled to associated mixers 570A/B, which may contain beamsplitters or other optics to facilitate transmission and reception of beams across propagation medium 530. In an embodiment, connections transmitted over propagation medium 530 may be optical beams through one or more of the air, space, fiber optic cabling, or so on. Outputs from master clock 100A and slave clock 100B, or from time interval counter 550A and time interval counter 550B may also by connected by data cables or any other data transfer mechanism that may provide information about master clock 100A and slave clock 100B to each, as described in greater detail below. In an embodiment, such data connections may be included over propagation medium 530.

To synchronize master clock 100A and slave clock 100B, it is to be initially understood that slave clock 100B is to be time-adjusted to match master clock 100A. The accuracy of the synchronization may depend on the frequency bandwidth of the transfer signals between synchronization system 300A and synchronization system 300B over propagation medium 530. In some embodiments, the designation of which clock is the master and which clock is the slave may change, whereby signals indicating the assigned designation may be transmitted between clocks. In an embodiment, the transfer signals over propagation medium 530 are ultra-short optical or near-optical pulses that are spectroscopically discernible, as described in greater detail below. In an embodiment, mixers 570 may include optics and beam splitters to deliver optical pulses (i.e. ultrashort optical pulses) to each receiver 560, such that each time interval counter 550 may measure a time difference between that of the local pulse L and when the remote pulse R is received from the remote transmitter. In some embodiments, remote optical pulses may be detected by receivers 560. In other embodiments, the remote optical pulses and the local optical pulses may be converted to data in a controller (not shown), and the data of an adjustment offset established by master clocks 100A for slave clock 100B would be communicated by other means to adjust slave clock 100B accordingly.

In an embodiment, the time adjustment of slave clock 100B may be based on measuring the time-of-arrival and/or the time-of-flight for the pulses, which may allow synchronization accuracy and performance of distance metrology between master clock 100A and slave clock 100B once their clocks are synchronized. To perform such clock synchronization, ultrashort optical pulses may be transmitted from master clock 100A and slave clock 100B at what is believed to be the same time. Prior to this transmission of ultrashort optical pulses over propagation medium 530, the clocks 100A and 100B may be roughly synchronized, such as by data transmission of the "current" time from master clock 100A to slave clock 100B, such that slave time interval counter 550B is adjusted accordingly.

Figure 9:
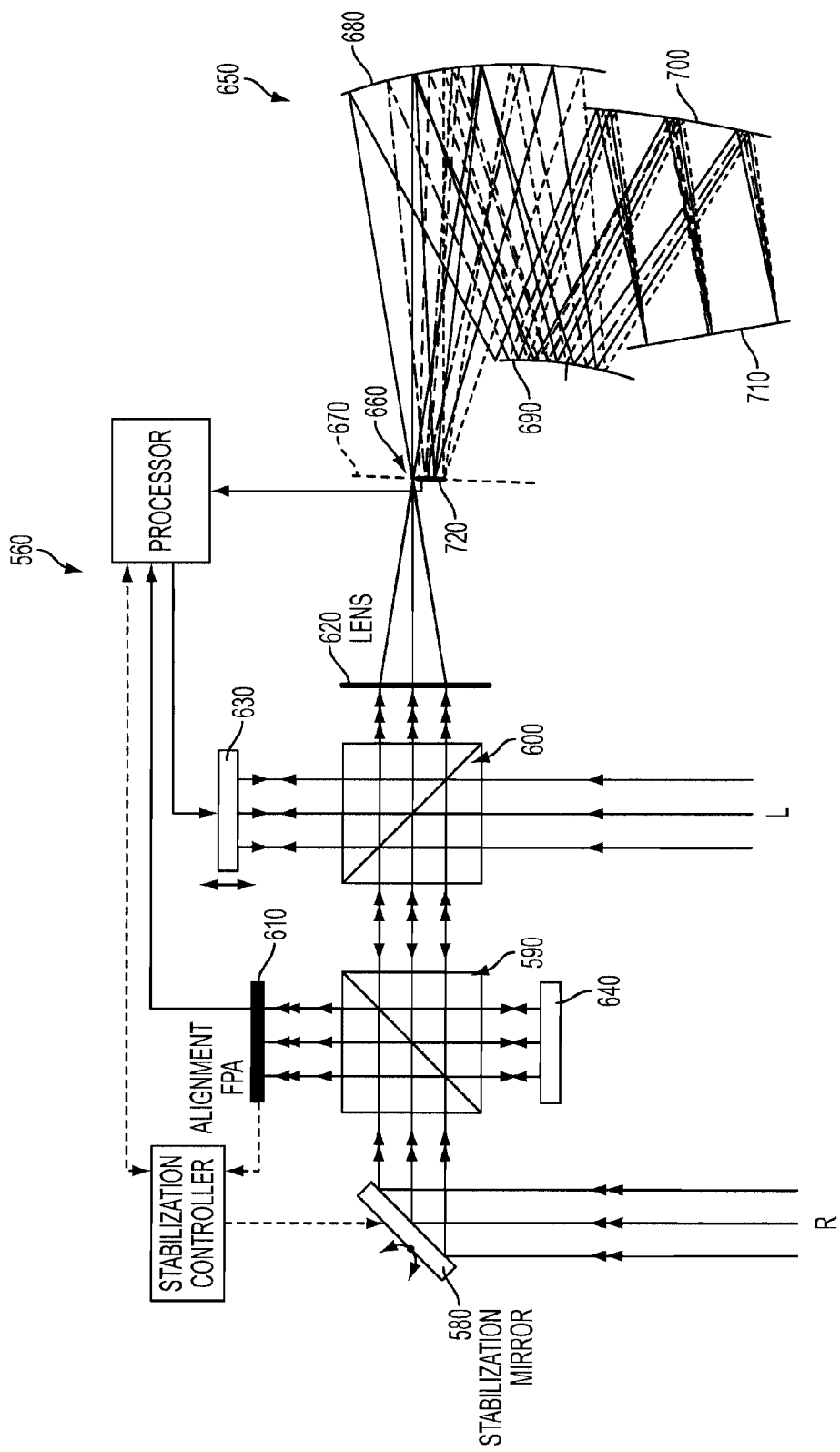
FIG. 9 shows an embodiment of the synchronization system configured to measure the interference of femtosecond laser pulses generated by the remote clock and the local clock, to determine a time delay therebetween.

In FIG. 9, a portion of an embodiment of one of receivers 560 is schematically depicted. As shown, the receiver 560 may include stabilization mirror 580, configured to stabilize remote pulse R from the remote clock 100. Stabilization mirror 580 may be configured to correct any number of issues associated with the distance traversed by remote pulse R, including, for example, spatial jitters due to scintillation in the atmosphere, vibration in the platform of master clock 100A and/or slave clock 100B, or any other movement that affects the alignment and stability of remote pulse R. In the illustrated embodiment, stabilization mirror 580 is shown to pivot such that remote pulse R may be spatially aligned with local pulse L. In the embodiment shown in FIG. 1, local pulse L may be the beam split from femtosecond laser 190 by beamsplitter 280 for local clock 100. Likewise, remote pulse R may be the beam split from an associated femtosecond laser 190 by associated beamsplitter 280 for remote clock 100. Receiver 560 is shown to include first beamsplitter 590 and second beamsplitter 600. Remote pulse R is shown to reflect off of stabilization mirror 580, and impact first beamsplitter 590, both deflecting at an angle towards alignment array 610, and passing ahead towards lens 620. Local pulse L both intercepts second beamsplitter 600, both deflecting at an angle towards first beamsplitter 590, and also passing through second beamsplitter 600 ahead towards delay mirror 630, described in greater detail below. The portion of local pulse L that is reflected towards first beamsplitter 590 reflects at an angle towards flat mirror 640, which then passes through first beamsplitter 590, to also be imaged on alignment array 610. The portion of local pulse L that has reflected from delay mirror 630 then reflects at an angle from second beamsplitter 600, towards lens 620.

The interception of remote pulse R and local pulse L on alignment array 610 allows for coarse alignment of the pulses. Stabilization mirror 580 may pivot to spatially align remote pulse R to that of local pulse L. For example, stabilization mirror 580 may normalize the angle of remote pulse R to that of local pulse L. Likewise, other optical elements may be in the path of remote pulse R and local pulse L to permit coarse pulse alignment. Alignment array 610 may be connected to a stabilization controller configured to adjust stabilization mirror 580 to spatially align local pulse L and remote pulse R. In an embodiment, the stabilization controller may be a part of a processor, computer, or other electronics associated with synchronization system 300. Although in the illustrated embodiment, delay mirror 630 is configured to adjust a phase of the portion of local pulse L directed towards lens 620, instead of any of the pulse directed towards alignment array 610, in some embodiments, at least a portion of either of the pulses may be configured to impact delay mirror 630, or a separate delay mirror, before being reflected onto alignment array 610, allowing fringes to form in an interference pattern between remote pulse R and local pulse L at alignment array 610. In such an embodiment, a processor or controller associated with alignment array 610 and delay mirror 630 may be utilized for a coarser phase adjustment of the pulses. In some embodiments, local pulse L and remote pulse R may be brought to an image for coarse alignment. Through measurements taken at alignment array 610, and adjustments made by stabilization mirror 580, delay mirror 630, and/or other optics, the frequencies of local pulse L and remote pulse R may be lined up, so that a phase difference may be ascertained.

In the illustrated embodiment, the amount of local pulse L and remote pulse R that are directed through lens 620 are directed into interferometer 650, which may be configured for fine alignment of the pulses. The concepts of coarse and fine adjustments are relative, however, and in an embodiment, coarse alignment may be performed outside of receiver 560, fine alignment may be performed at alignment array 610, and hyper-fine alignments may be performed with interferometer 650. Interferometer 650 may be of any suitable construction or configuration, including but not limited to a field or linear interferometer (such as a spectral interferometer, a Fabry-Perot interferometer, or so on). In some embodiments, interferometer 650 may be a non-linear interferometer, such as one making use of frequency resolved optical gating (FROG). In the illustrated embodiment, interferometer 650 is a spectral interferometer arranged with a three mirror "reflective triplet" design form, which may enhance the spectral resolution at the image plane formed by interferometer 650.

In the illustrated embodiment, lens 620 focuses the pulses onto pinhole 660 of interferometer 650, which may be located at image plane 670. The pulses diverge from pinhole 660 out towards primary mirror 680. After impacting primary mirror 680, the pulses are reflected onto secondary mirror 690, and then onto tertiary mirror 700. As the pulses reflect from tertiary mirror 700, they impact dispersive element 710. In the illustrated embodiment, dispersive element 710 is a diffraction grating configured to disperse the pulses into spectra directed back towards tertiary mirror 700. In other similar embodiments, dispersive element 710 may be a prism (and may be coupled with a mirrored side for rear surface reflection, or a spaced mirror in a minimum deviation configuration). As the dispersed spectra are reflected back through tertiary mirror 700, secondary mirror 690, and primary mirror 680, they may land on interferometer imager 720, which in the illustrated embodiment is located on image plane 670, spaced from pinhole 660. In an embodiment, such as that shown, interferometer imager 720 may read out to a processor associated with delay mirror 630, such that the phase local pulse L may be tuned to enhance the fringes formed at interferometer imager 720. As indicated above, the processor may be any processor, computer, or electronics associated with synchronization system 300, and in some embodiments may be associated with or contain the stabilization controller configured to adjust stabilization mirror 580. A prescription for one non-limiting embodiment of interferometer 650 is provided in FIG. 10. Interferometer imager 720 may be of any construction or configuration, including but not limited to being a linear focal plane array, a charge coupled device, a complementary metal-oxide semiconductor (CMOS), or so on.

Through analysis of the output of interferometer 650, the timing difference between remote pulse R and local pulse L may be ascertained. Such a calculation would utilize knowledge of the spectral characteristics of local pulse L and remote pulse R, to solve for a time delay $t_0$ between remote pulse R and local pulse L. In an embodiment, the pulses may be characterized by the formula:

$$L(t) = e^{-[\frac{2t}{\tau}]^2 \frac{\ln(2)}{2}} \cos(2\pi f_0 t)$$

where t is the pulse width (for example, 35 fsec FWHM from femtosecond lasers 190) and $f_0=c/\lambda$ (for example, $\lambda=840$ nm from femtosecond lasers 190). The spectrum of local pulse L may then be characterized as:

$$L(f) = e^{-\left[\frac{2*(f-f_0)}{BW}\right]^2 * \frac{\ln(2)}{2}}$$

where only the positive frequency is taken from the cosine term. BW may be defined as:

$$BW = \frac{2*\ln(2)}{\pi\tau}$$

The spectrum of the remote pulse R may then be defined as:

$$R(f) = be^{-\left[\frac{2*(f-f_0)}{BW}\right]^2 * \frac{\ln(2)}{2}} e^{-j2\pi f t_0}$$

where the constant "b" is included to show a difference in amplitude between local pulse L and remote pulse R. Again, $t_0$ is the time delay for remote pulse R to travel the extra distance associated with delay mirror 630.

When interfering remote pulse R and local pulse L, the interference W may then be characterized as:

$$W = |L + R|^2$$
$$= L(f)(1 + b^2 + 2b\cos(2\pi f t_0)).$$

Since the spectral characteristics of the pulses are known, including, for example, the frequency of the pulses and the amplitude of the pulses, the time delay $t_0$ between the pulses, corresponding to the unknown phase component between remote pulse R and local pulse L, may be solved for. The processing of the output of interferometer 650 (such as the data received by interferometer imager 720) may be accomplished by any mechanism. For example, in an embodiment, the data may be automatically processed by a controller associated with or part of one or more of receiver 560, clock 100, or time interval counter 550. The controller may also account for any known noise or errors that may be compensated for. An evaluation of the Doppler shift due to a moving platform for synchronization system 300A and/or synchronization system 300B has also been evaluated, and such effects are believed to be negligible. One evaluation considered a moving platform synchronizing with either a stationary or another moving platform. In an embodiment, a relative velocity between two platforms of 7 km/sec produces a change of 0.01%. Velocities less than 7 km/s would produce an even smaller change. Thus, platforms that move up to orbital velocities will generally not produce significant error in the measurement. However these and other sources of noise and delays, such as computation time, for example, may be taken into account by the controller.

Figure 11:
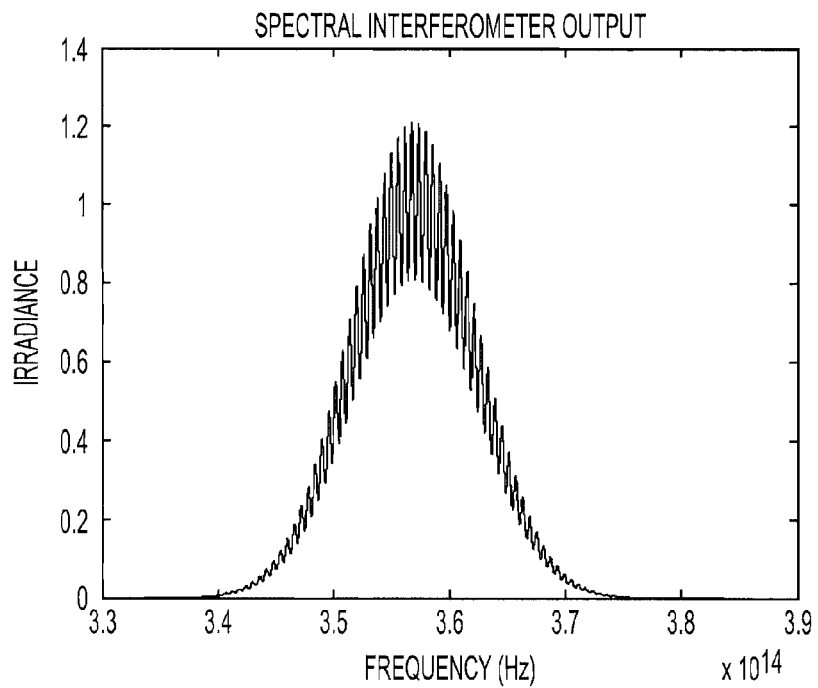
FIG. 11 plots an interference pattern output of the spectral interferometer of FIG. 10 as a function of frequency.
Figure 12:
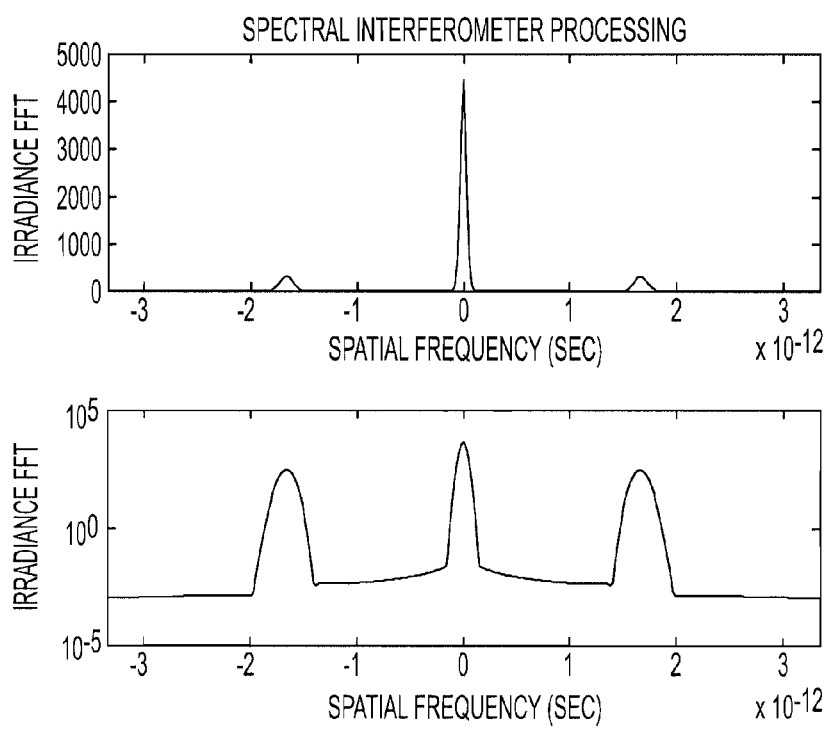
FIG. 12 plots outputs of a Fourier transformation to ascertain a spatial frequency separation from the interference pattern, in both a linear and a logarithmic scale.

Although where interferometer 650 is a spectral interferometer, the output at interferometer imager 720 would typically be plotted as irradiance over the wavelength of the interfered pulses, the received data may be easily converted into the frequency domain. An example of this output is depicted in FIG. 11, which depicts the irradiance over the pulse frequencies of approximately 330 to 390 THz. A Fourier transform may be utilized to process the output to measure the modulation frequency of the pulses. As is shown in FIG. 12, the cosine term in the pulse equation creates positive and negative lobes, the location of which correspond to the time delay $t_0$. As seen in the depicted example, the delay between the pulses $t_0$ can be computed as approximately 1.6 picoseconds. In an embodiment, the system will have accuracy down to a fraction of a pulse width limited by the spectral bandwidth of the interferometer. In some embodiments, other transformations, including but not limited to Hilbert or Lorentzian transformations, may additionally or alternatively be utilized in the mathematical analysis. Further analysis of the lobe can be performed to more precisely determine the phase difference of the pulses, such as by comparing the real and imaginary components of the waveform function, however a determination of the peak of the lobe may also be sufficient to ascertain the time delay $t_0$.

In an embodiment, the time delay $t_0$, which may be the accuracy, resolution or error at which the two clocks can be synchronized, (i.e. the shortest time that is measured by the system), may be utilized to determine the amount by which local pulse L must be advanced or delayed to match remote pulse R, or vice versa. In an embodiment, the amount of advance or delay may be significantly greater than accuracy/resolution value $t_0$. In an embodiment wherein the remote clock 100 providing remote pulse R is master clock 100A, local pulse L from slave clock 100B will be advanced or delayed (or the amount of offset will be compensated for by the slave time interval counter 550B) so that slave clock 100B will be time adjusted to match master clock 100A. In another embodiment, wherein the local clock is master clock 100A, the full time offset measurement may be communicated to the remote slave clock 100B, such that the remote clock may be advanced or delayed to match local master clock 100A.

In some cases, such as in two-way time transfer, the time offset would be calculated at both master clock 100A and slave clock 100B, and may be subsequently transmitted by each clock to the other for precise clock synchronization. As was shown in FIG. 8, where master clock 100A and slave clock 100B are linked over propagation medium 530, a propagation delay time in the direction from master clock 100A to slave clock 100B may be designated as $D_{AB}$ while a propagation delay time in the direction between slave clock 100B and master clock 100A may be designated as $D_{BA}$. The master clock signal transmission time is $T_A$, while the slave clock signal transmission time is $T_B$. The measurement at master clock 100A is therefore $T_{meas(A)}=T_A-T_B+D_{AB}$, which again, may be measured to an accuracy/resolution of $t_0$. Accordingly, the measurement at slave clock 100B is $T_{meas(B)}=T_B-T_A+D_{BA}$. To synchronize slave clock 100B to master clock 100A, $T_{meas(A)}$ and $T_{meas(B)}$ will be transmitted to either or both of master clock 100A and slave clock 100B, depending on the master/slave protocol. The time delay to steer slave clock 100B to master clock 100A can then be calculated, in that:

$$T_{meas(B)}-T_{meas(A)}=(T_B-T_A)+D_{BA}-(T_A-T_B)-D_{AB}$$

$$\tfrac{1}{2}(T_{meas(B)}-T_{meas(A)})=(T_B-T_A)+\tfrac{1}{2}(D_{BA}-D_{AB}).$$

Therefore, provided that the propagation time is the same regardless of direction (and $D_{AB}=D_{BA}$), the following result is obtained:

$$\tfrac{1}{2}(T_{meas(B)}-T_{meas(A)})=(T_B-T_A),$$

such that slave clock 100B is steered to agree with master clock 100A.

In an embodiment, to perform such two-way time transfer synchronization, at what is believed to be the same time, a pulse from each local femtosecond laser (i.e. femtosecond laser 190), operating at a pulse repetition frequency that is known to both clocks, is transmitted to the respective remote clock. Upon transmission, each local time interval counter begins measuring the time between the transmitted pulse and the arrival of the pulse from the remote clock. Once the remote pulse arrives the time interval counter has measured a coarse time interval, and the system knows when to expect the arrival of the next pulse from the remote clock. With this information synchronization system 300 determines if the local pulse has to be delayed or advanced with respect to the predicted arrival of the remote pulse to begin to measure interference fringes with spectral interferometer 650. In an embodiment, this fine adjustment may be accomplished with a variable delay line (such as but not limited to comprising mechanically movable mirrors) that may be physically moved to increase or decrease the distance traveled by the pulse, where every millimeter equates to a change in time of approximately 3.33 picoseconds. The total delay of this mechanical adjustment may be equivalent to the inverse of the femtosecond laser pulse repetition frequency, and may have less than millimeter resolution. Once interference fringes are detected, the local synchronization system 300 may make further adjustments to optimize the interference pattern, to obtain a more precise time measurement. In an embodiment, the time interval counter may make a coarse time measurement, the effect of moving variable delay mirror 630 may make a fine time measurement, and the calculation of the interference fringes may make a precise time measurement. In an embodiment, the total offset time may comprise a combination of all three. In an embodiment, measurement of the movement of the variable delay line and/or performance of the calculations described above may also be measured by any processor, computer, or electronics associated with synchronization system 300.

As an example of the calculations above, if the time interval counter associated with master clock 100A measures 1 million intervals, where each interval is equal to 100 picoseconds (i.e. 100 microseconds over the 1 million intervals), and it is determined that the variable delay needs to advance by 212.1 mm (equivalent to 706.99 picoseconds or 706,990 femtoseconds), and the fringe measurement determines a separation of 37 femtoseconds, then the measured delay is 100.000707027 microseconds at master clock. 100A. If slave clock 100B measured the difference between when it transmitted and received the pulses to be 100.032550123 microseconds, then the measured difference between the clocks is 0.031843096 microseconds or 31.843096 nanoseconds. Using the two-way transfer formulas above, the offset of the two clocks may be determined to be one half of this value. Therefore, slave clock 100B would be steered by 15.921548 nanoseconds to be in synch with the master clock 100A.

The result above does not account for noise. While noise in the transfer system, reference oscillators 110 in master clock 100A and slave clock 100B, and the signal frequency determine the integration time to achieve synchronization, the methodology remains the same. Once accomplished or accounted for, the synchronization of slave clock 100B to master clock 100A may be maintained to a given accuracy for a period of time that is governed by the stability of the reference oscillators 110, as described above.

The synchronization techniques disclosed herein, utilizing the transfer of femtosecond pulses, may be integrated on any number of platforms. For example, master clock 100A and slave clock 100B may be located in a pair of satellites having a designated Master/Slave configuration. While the distance between master clock 100A and slave clock 100B may exceed that to accurately transfer of the stability from femtosecond lasers 190 on each; the interference pattern of the pulses may still be measured by an interferometer, and used to calculate a time delay between master clock 100A and slave clock 100B. The time difference measurement on each satellite may be used to calculate the time offset between the clocks, and once the clocks are synchronized, continued pulses exchanges can determine the range between the satellites. In an embodiment, this determination may have an accuracy of the pulse width times the speed of light. For example, with a 100 femtosecond pulse the line of sight distance between the satellites may be ascertained to within 30 microns. From this, the slave satellite may adjust its clock to that of the master to reduce the offset to within the error of the measurement system which is a fraction of the optical pulse width.

While certain embodiments have been shown and described, it is evident that variations and modifications are possible that are within the spirit and scope of the inventive concept as represented by the following claims. The disclosed embodiments have been provided solely to illustrate the principles of the inventive concept and should not be considered limiting in any way.

What is claimed is:

1. A system for distributing a reference timing signal comprising:
   a clock comprising:
      a reference oscillator arranged to generate the reference timing signal;
      a femtosecond laser configured to produce a femtosecond laser pulse sequence stabilized by the reference oscillator; and
      at least one beamsplitter configured to split the femto second laser pulse sequence into one or more split laser pulse sequences,
   one or more remote nodes that are spaced from the clock, and configured to generate distributed timing signals corresponding to the reference timing signal, based on associated ones of the one or more split laser pulse sequences, and
   a noise reducer for each remote node configured to stabilize a phase of an associated one of the split laser pulse sequences based on a reflected version of the split laser pulse sequence that is reflected from the remote node.

2. A system for distributing a reference timing signal comprising:
   a clock comprising:
      a reference oscillator arranged to generate the reference timing signal;
      a femtosecond laser configured to produce a femtosecond laser pulse sequence stabilized by the reference oscillator; and
      at least one beamsplitter configured to split the femto second laser pulse sequence into one or more split laser pulse sequences,
   one or more remote nodes that are spaced from the clock, and configured to generate distributed timing signals corresponding to the reference timing signal, based on associated ones of the one or more split laser pulse sequences, and
   a transfer laser configured to generate a frequency reference locked to a femtosecond frequency comb associated with the reference oscillator, wherein the one or more remote nodes are configured to generate the distributed timing signals based on the frequency reference from the transfer laser.

3. The system of claim 2, wherein at least one of the one or more remote nodes comprises a microwave converter configured to generate a microwave frequency comb.

4. The system of claim 2, wherein the transfer laser is cavity stabilized.

5. The system of claim 2, further comprising a noise reducer configured to stabilize a phase of the frequency reference.

6. The system of claim 5, wherein the noise reducer comprises a phase locked loop and an acousto-optical modulator.

7. The system of claim 2, wherein the one or more remote nodes are configured to generate a remote femto second laser frequency comb, and wherein the distributed timing signal is generated by locking the remote femtosecond laser frequency comb to the frequency reference of the transfer laser.

8. The system of claim 2, further comprising one or more additional nodes coupled to at least one of the one or more remote nodes, the one or more additional nodes configured to generate additional timing signals associated with the reference timing signal, directly or indirectly from the frequency reference of the transfer laser.

9. The system of claim 2, wherein the reference oscillator is an optical reference oscillator stabilized by an atomic transition of calcium, magnesium, mercury, rubidium, cesium, aluminum, strontium, or ytterbium.

10. A method for distributing a reference timing signal comprising:
    generating, at a reference oscillator, a reference timing signal;
    producing, with a femtosecond laser, a femtosecond laser pulse sequence stabilized by the reference oscillator;
    splitting the femto second laser pulse sequence into one or more split laser pulse sequences;
    generating, at one or more remote nodes spaced from the clock and associated with the one or more split laser pulse sequences, distributed timing sequences corresponding to the reference timing signal, based on the femto second laser pulse sequence; and
    generating, with a transfer laser, a transfer laser frequency reference locked to a femtosecond frequency comb associated with the femtosecond laser pulse sequence;
    wherein generating the distributed timing sequences is further based on the transfer laser frequency reference.

11. The method of claim 10, further comprising generating a microwave frequency comb at the one or more remote nodes, wherein generating the distributed timing sequences is based on the microwave frequency comb.

12. The method of claim 10, wherein the transfer laser is cavity stabilized.

13. The method of claim 10, further comprising stabilizing a phase of the transfer laser using a noise reducer comprising a phase locked loop and an acousto-optical modulator.

14. The method of claim 10, further comprising generating at one or more additional nodes coupled to at least one of the one or more remote nodes, additional distributed timing sequences associated with the reference timing signal, directly or indirectly from the transfer laser frequency reference.

15. The method of claim 10, further comprising generating, at one or more of the one or more remote nodes, a remote femtosecond laser frequency comb, wherein generating the distributed timing signal comprises locking the remote femtosecond laser frequency comb to the transfer laser frequency reference.

16. A clock comprising:
    a reference oscillator;
    a femtosecond laser configured to produce a femtosecond laser pulse sequence stabilized by the reference oscillator; and
    a beamsplitter in a path of the femtosecond laser pulse sequence, configured to redirect at least a portion of the femtosecond laser pulse sequence to a distribution system;
    wherein the distribution system comprises a transfer laser configured to produce a frequency reference that is locked to the femtosecond laser pulse sequence, and one or more beamsplitters configured to distribute the frequency reference of the transfer laser to one or more remote nodes.

17. The clock of claim 16, wherein the reference oscillator is an optical reference oscillator stabilized by an atomic transition of calcium, magnesium, mercury, rubidium, cesium, aluminum, strontium, or ytterbium.

18. The clock of claim 16, wherein the one or more remote nodes are spaced from the clock and configured to generate reference signals based on the distributed transfer laser beam.

19. A system for distributing a reference timing signal comprising:
    a clock comprising a reference oscillator arranged to generate the reference timing signal, and a femtosecond laser configured to produce a femtosecond laser pulse sequence stabilized by the reference oscillator;
    at least one beamsplitter configured to split the femto second laser pulse sequence into one or more split laser pulse sequences; and
    a transfer laser configured to generate a frequency reference locked to a femto second frequency comb associated with the reference oscillator; and
    one or more remote nodes that are spaced from the clock that are configured to generate distributed timing signals based on associated ones of the one or more split laser pulse sequences,
    wherein to generate the distributed timing signals, each of the one or more remote nodes are configured to generate a remote femto second laser frequency comb and lock the remote femto second laser frequency comb to the frequency reference of the transfer laser.

20. The system of claim 19, further comprising a noise reducer for each remote node configured to stabilize a phase of an associated one of the split laser pulse sequences based on a reflected version of the split laser pulse sequence that is reflected from the remote node.

21. The system of claim 20, wherein the transfer laser is a CW laser that is cavity stabilized, and
    wherein the noise reducer comprises a phase locked loop and an acousto-optical modulator.

22. The system of claim 20 wherein the remotes nodes are at least one hundred kilometers from the clock.

* * * * *

UNITED STATES PATENT AND TRADEMARK OFFICE
CERTIFICATE OF CORRECTION

| | | |
|---|---|---|
| PATENT NO. | : 8,565,609 B2 | Page 1 of 2 |
| APPLICATION NO. | : 12/969324 | |
| DATED | : October 22, 2013 | |
| INVENTOR(S) | : Wilkinson et al. | |

It is certified that error appears in the above-identified patent and that said Letters Patent is hereby corrected as shown below:

On the title page, in column 2, References Cited under "Other Publications", line 8, delete "A," and insert --A.,--, therefor On the title page, in column 2, References Cited under "Other Publications", line 8, delete "delievery" and insert --delivery--, therefor On the title page, in column 2, References Cited under "Other Publications", line 12, delete "W," and insert --W.,--, therefor In the Specification In column 5, line 37, after "180", delete "with which", therefor In column 6, line 59, before "beam", insert --distribution--, therefor In column 8, line 31, delete "by" and insert --be--, therefor In column 8, line 34, after "each", insert --other--, therefor In column 13, line 46, delete "clock." and insert --clock--, therefor In the Claims In column 14, line 37-38, in Claim 1, delete "femto second" and insert --femtosecond--, therefor In column 14, line 57-58, in Claim 2, delete "femto second" and insert --femtosecond--, therefor Signed and Sealed this
Fifth Day of August, 2014

Michelle K. Lee
*Deputy Director of the United States Patent and Trademark Office*

CERTIFICATE OF CORRECTION (continued)
U.S. Pat. No. 8,565,609 B2

In column 15, line 15, in Claim 7, delete "femto second" and insert --femtosecond--, therefor In column 15, line 35, in Claim 10, delete "femto second" and insert --femtosecond--, therefor In column 15, line 41, in Claim 10, delete "femto second" and insert --femtosecond--, therefor In column 16, line 35-36, in Claim 19, delete "femto second" and insert --femtosecond--, therefor In column 16, line 39, in Claim 19, delete "femto second" and insert --femtosecond--, therefor In column 16, line 47, in Claim 19, delete "femto second" and insert --femtosecond--, therefor In column 16, line 48, in Claim 19, delete "femto second" and insert --femtosecond--, therefor In column 16, line 59, in Claim 22, delete "remotes" and insert --remote--, therefor